US006777765B2

(12) United States Patent
Chen et al.

(10) Patent No.: US 6,777,765 B2
(45) Date of Patent: Aug. 17, 2004

(54) CAPACITIVE TYPE MICROELECTROMECHANICAL RF SWITCH

(75) Inventors: Li-Shu Chen, Ellicott City, MD (US); Howard N. Fudem, Baltimore, MD (US); Donald E. Crockett, Columbia, MD (US); Philip C. Smith, Ellicott City, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 156 days.

(21) Appl. No.: 10/322,728

(22) Filed: Dec. 19, 2002

(65) Prior Publication Data

US 2004/0119126 A1 Jun. 24, 2004

(51) Int. Cl.[7] .................................................. H01L 29/82
(52) U.S. Cl. ........................ 257/415; 200/181; 333/262
(58) Field of Search ......................... 361/281; 333/262; 257/415; 200/181, 600

(56) References Cited

U.S. PATENT DOCUMENTS 6,100,477 A * 8/2000 Randall et al. ............. 200/181
6,507,475 B1 * 1/2003 Sun ............................ 361/281

* cited by examiner

*Primary Examiner*—Douglas A Wille
(74) *Attorney, Agent, or Firm*—Birch, Stewart, Kolasch & Birch, LLP

(57) ABSTRACT

A capacitive type MEMS switch having a conductor arrangement comprised of first and second RF conductors deposited on a substrate. A bridge member having a central enlarged portion is positioned over the conductor arrangement. In one embodiment, the first RF conductor has an end defining an open area in which is positioned a pull down electrode, with the end of the first RF conductor substantially surrounding the pull down electrode. In another embodiment, two opposed RF conductors, each having ends with first and second branches, define an open area in which a pull down electrode is positioned. A dielectric layer is deposited on the conductor arrangement such that when a pull down voltage is applied to the pull down electrode, the switch impedance is significantly reduced so as to allow signal propagation between the RF conductors.

6 Claims, 3 Drawing Sheets

CAPACITIVE TYPE MICROELECTROMECHANICAL RF SWITCH

CROSS-REFERENCE TO RELATED APPLICATIONS

The present invention is related in subject matter to patent application Ser. No. 10/157,935, now U.S. Pat. No. 6,657, 525 filed May 31, 2002, and to patent application Ser. No. 10/321,562 now U.S. Pat. No. 6,639,494, filed concurrently herewith, all of which are assigned to the same assignee as the present invention.

BACKGROUND OF THE INVENTION

1. Field of the Invention

The invention in general relates to miniature switches, and more particularly, to a capacitive type MEMS switch useful in radar and other microwave applications.

2. Description of Related Art

A variety of MEMS (microelectromechanical systems) switches are in use, or proposed for use, in radar and communication systems, as well as other high frequency circuits for controlling RF signals. These MEMS switches are popular insofar as they can have a relatively high off impedance, with a low off capacitance, and a relatively low on impedance, with a high on capacitance, leading to desirable high cutoff frequencies and wide bandwidth operation. Additionally, the MEMS switches have a small footprint, can operate at high RF voltages and are compatible with conventional integrated circuit fabrication techniques.

Many of these MEMS switches generally have electrostatic elements, such as opposed electrodes, which are attracted to one another upon application of a DC pull down control voltage. An opposed electrode is defined on the underside of a two-arm moveable bridge above the pull down electrode. Upon application of the DC pull down control voltage, the bridge is deflected down and, by the particular high capacitive coupling established, the electrical impedance is significantly reduced between first and second spaced apart RF conductors on a substrate member, thus allowing a signal to propagate between the first and second conductors.

In the capacitive type MEMS switch, a dielectric layer is deposited on the first conductor in an area opposite the underside of the two-arm moveable bridge, with this area on the conductor acting as the pull down electrode. With this arrangement, the full pull down voltage appears across the dielectric layer resulting in a relatively high electric field across the dielectric. This high field leads to charge accumulation on the surface, as well as in the bulk dielectric. Once the dielectric accumulates enough charge, the switch will fail because the charge causes the switch to remain closed even after the pull down voltage is removed.

Another problem with conventional capacitive type MEMS switches occurs while the switch closes. The high electric field across the dielectric increases exponentially as the bridge moves toward the dielectric until it makes contact with the dielectric. The high field generated during the switch closing causes metal to deposit onto the dielectric from the bridge, thus degrading the value of capacitance in the closed position to unacceptable values.

In addition, work has been done in the development of metal-to-metal MEMS switches where the moving metal bridge directly contacts the bottom metal plate. This type of switch is useful because it works over wide bandwidths, however the metal contacts wear after around one million cycles. The advantage of the capacitive type switch is that the presence of the dielectric layer avoids the wearing out of the switch contacts and has shown operation of around ten billion cycles.

The present invention obviates these objectionable charging and metal deposition problems in a capacitive type MEMS switch.

SUMMARY OF THE INVENTION

A capacitive type MEMS switch is described and comprises a substrate member with a conductor arrangement deposited on the substrate. The conductor arrangement includes first and second RF conductors and having a dielectric layer deposited on a portion of the conductor arrangement. A bridge member is positioned over a portion of the conductor arrangement and has a central portion with first and second arms extending out from the central portion and supported by respective first and second support members. The conductor arrangement defines an open area, and a pull down electrode, of a height less that that of the conductor arrangement, is positioned within this open area, and is substantially surrounded by the conductor arrangement. During operation the central portion of the bridge member is drawn toward the conductor arrangement upon application of a control voltage to the pull down electrode, to present a relatively low impedance, allowing a signal to propagate between the first and second RF conductors. The invention described here removes any DC voltage from the dielectric used in the switch. The pull down voltage is between the top metal and the pull down electrode with air inbetween. This eliminates the dielectric charging which plagues capacitance type MEMs switches, and also eliminates the deposition of material onto the dielectric surface which degrades the down capacitance.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

DESCRIPTION OF THE PREFERRED EMBODIMENT

Figure 1:
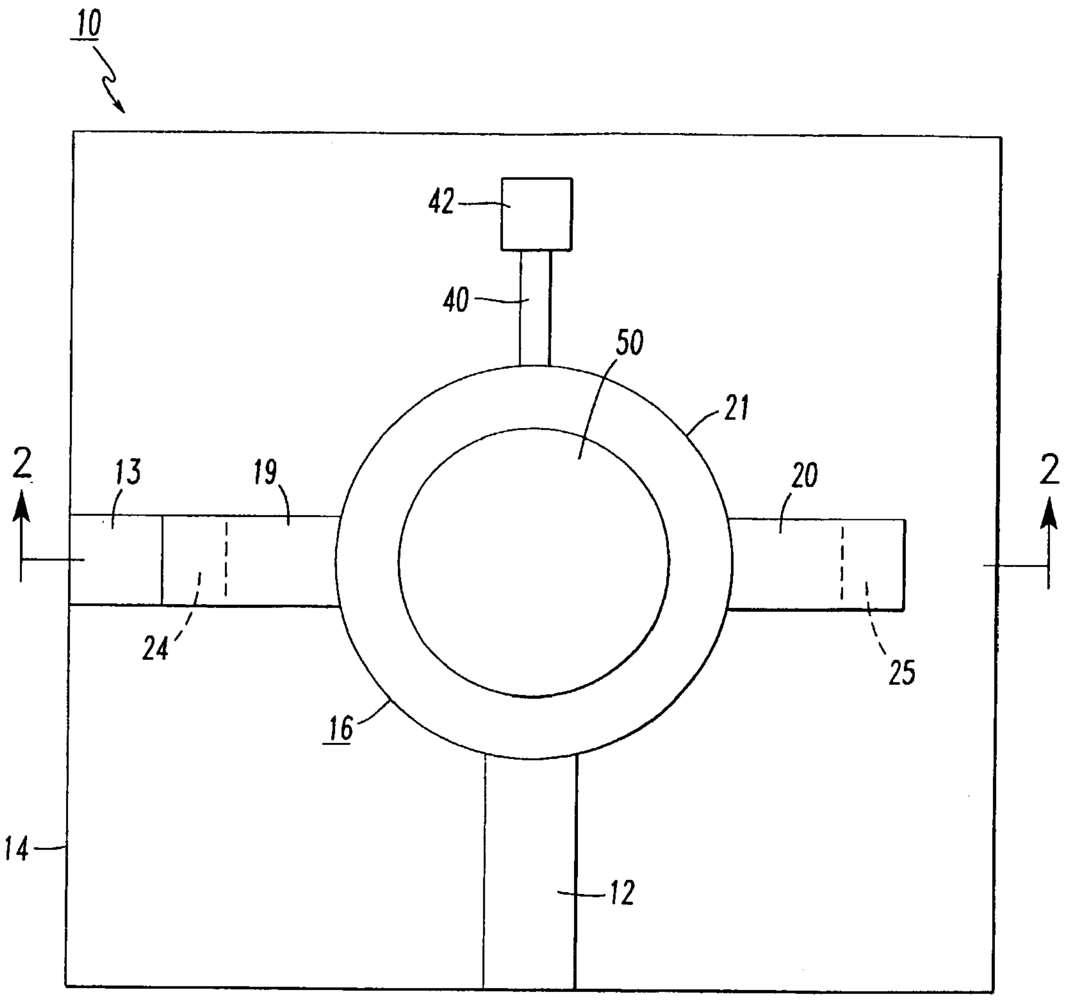
FIG. 1 is a plan view of a capacitive type MEMS switch in accordance with one embodiment of the present invention.
Figure 2:
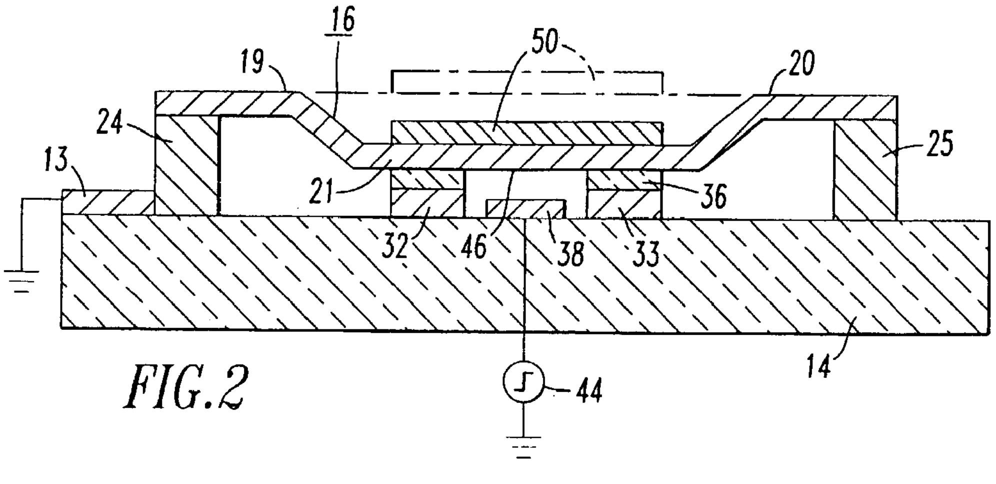
FIG. 2 is a view along line 2—2 of FIG. 1.
Figure 3:
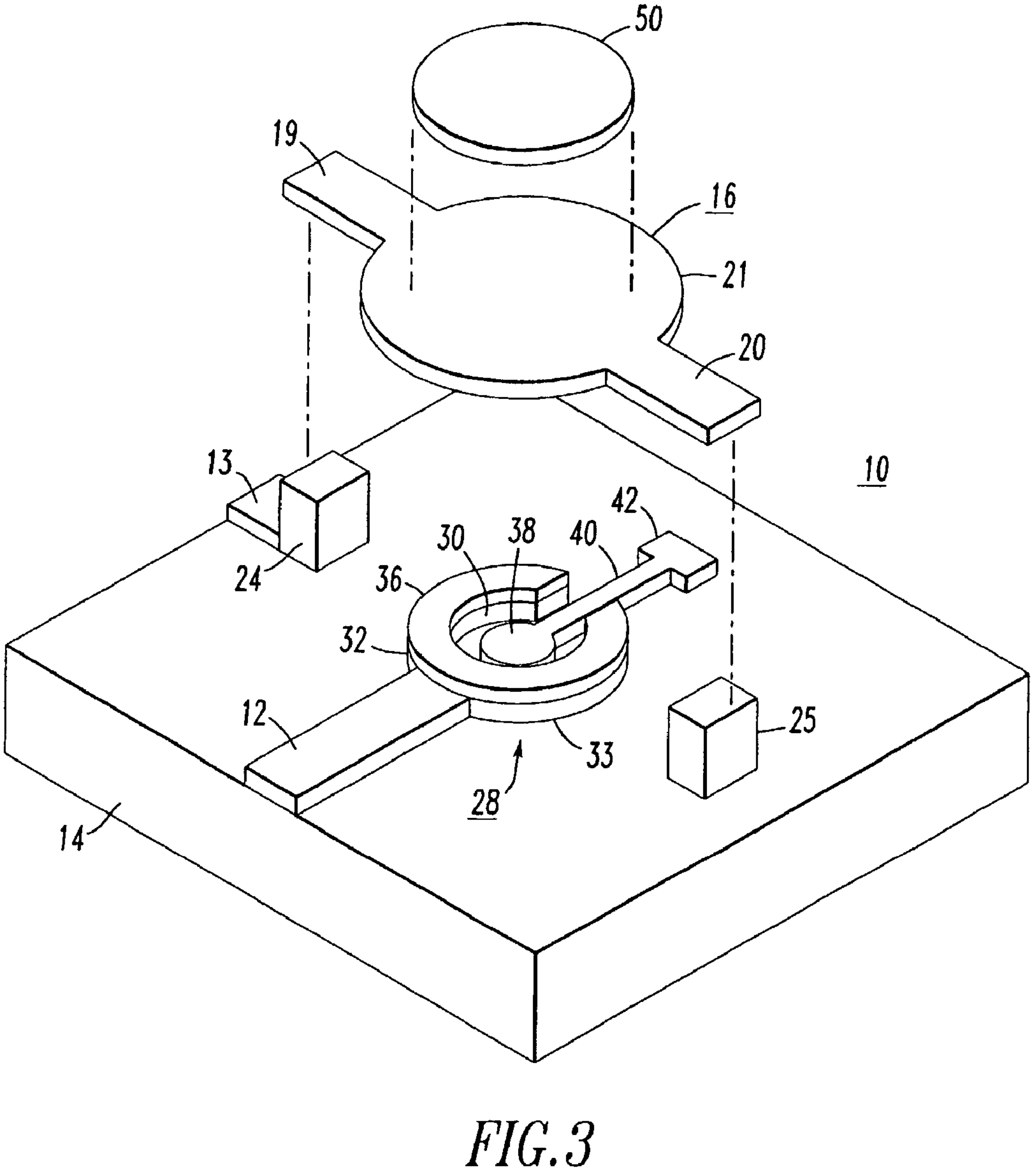
FIG. 3 is an exploded view of the switch of FIG. 1.

Referring now to FIGS. 1 to 3, the improved capacitive type MEMS switch 10 includes a conductor arrangement comprised of first and second spaced apart RF conductors 12 and 13, typically 50 ohm microstrips, deposited on a substrate 14, such as gallium arsenide, silicon, alumina or sapphire, by way of example.

Switch 10 includes a metallic bridge member 16 having two flexible arms 19 and 20 extending out from an enlarged central portion 21. The outer ends of the arms are connected to respective support members 24 and 25, at least one of which, 24, connected to conductor 13, is metallic so as to establish electrical continuity.

As best seen in FIG. 3, the first conductor 12 has an end 28 having an open area 30 defined by branches 32 and 33. A dielectric layer 36 is deposited on the end 28 to establish a capacitive type MEMS switch. Positioned on substrate 14 within the open area 30, and substantially surrounded by branches 32 and 33, is a pull down electrode 38 of a height less than that of branches 32 and 33, as best seen in FIG. 2.

Pull down electrode 38 is connected by a thin film bias resistor 40 to a pad 42, to which is applied the pull down voltage signal from source 44. The actual pull down electrode 38 can also be made out of the same resistor material as the bias resistor 40. Upon application of this pull down voltage to pad 42, the bridge 16 is deflected down by electrostatic attraction between the pull down electrode and the underside 46 of the bridge. That is, the bridge 16 goes from a normally off position, as depicted by the dotted member in FIG. 2, to the illustrated on position. In order to lend rigidity to the bridge 16 in the contact area, a stiffener 50 may be deposited on the top of central portion 21. This assures for a good contact as well as avoiding bending of the bridge 16, which would cause shorting to the pull down electrode 38.

In general, in a MEMS switch it is desired to have an extremely high impedance when in an open, or off condition, to substantially reduce or prevent signal propagation between conductors, and to have an extremely low impedance when in a closed, or on condition, to allow signal propagation. For a capacitive type MEMS switch, the ratio of off to on impedance is basically governed by the capacitance of the switch in these two conditions. With the present invention, the capacitance contact geometry can be optimized for the highest possible capacitance ratio. Since there is no electric field across the dielectric layer 36, the dielectric functions only as a mechanical stop for the central portion 21 of bridge 16, when the pull down voltage is applied to close the switch. This allows the dielectric layer to be much thinner than the dielectric layer of conventional capacitive type MEMS switches which must support the pull down voltage. Switch designs with the present invention can have capacitance ratios (on/off) in the order of 100:1, or greater.

In addition, the dielectric layer may be made relatively thin and may be selected from a class of materials chosen for hardness, hydrophobic surface or other desired properties, and independent of breakdown voltage. It is no longer necessary to use materials such as silicon nitride, currently used for its high breakdown qualities and having a dielectric constant of 6.4. Other materials with dielectric constants of around 180 may be used, giving a 30 times improvement in capacitance ratio.

Figure 4:
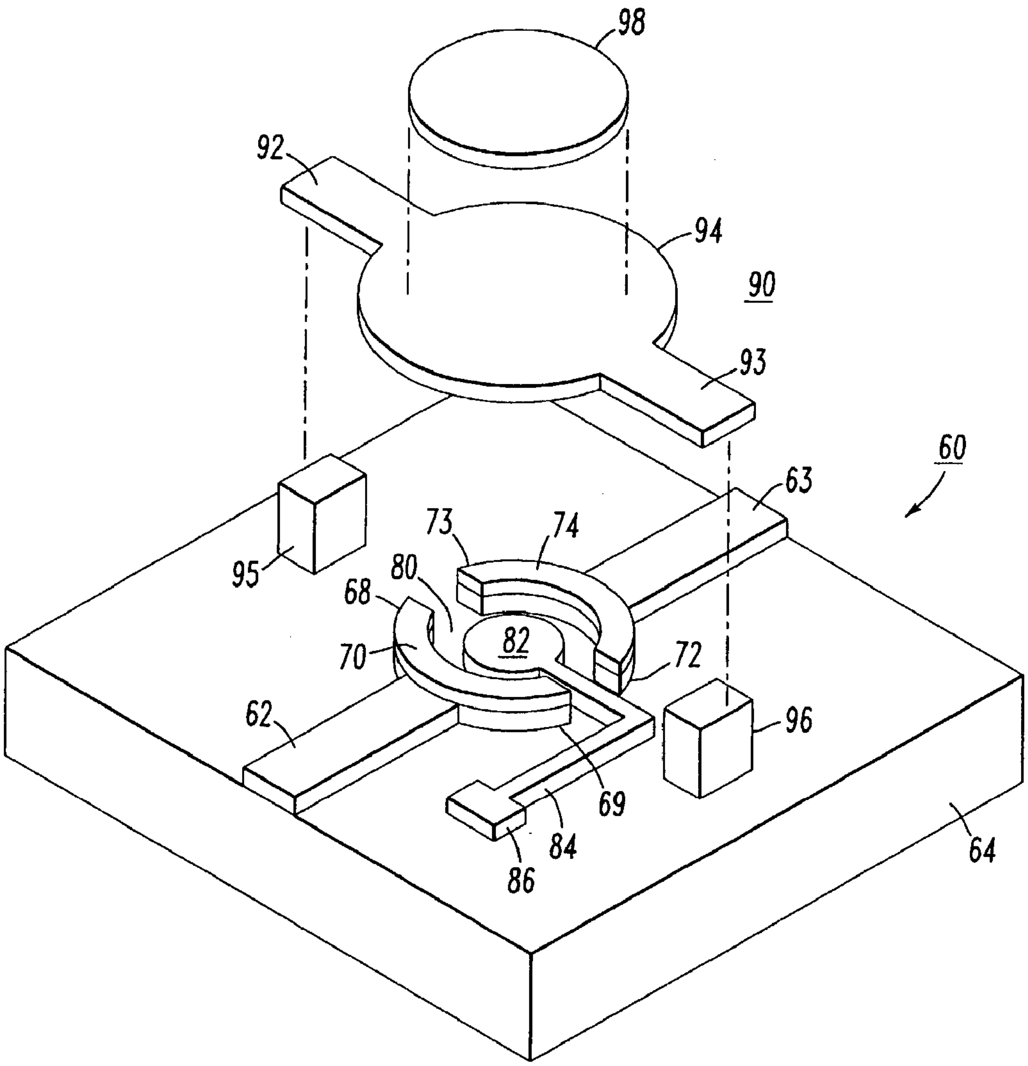
FIG. 4 is an exploded view of another embodiment of the present invention.

FIG. 4 illustrates an embodiment of the invention wherein the switch 60 includes a conductor arrangement comprised of two opposed conductors 62 and 63 deposited on substrate 64. Conductor 62 includes an end having two branches 68 and 69, covered by a dielectric layer 70. Similarly, Conductor 63 includes an end having two branches 72 and 73, covered by a dielectric layer 74.

The branches 68, 69 and 72, 73 at the ends of the two conductors 62 and 63, define an open area 80 in which is positioned pull down electrode 82. A thin film resistor 84 connects the pull down electrode 82 with pad 86, to which is applied the pull down voltage.

Switch 60 also includes a bridge member 90 having two flexible arms 92 and 93 extending out from an enlarged central portion 94 of a metallic material. The outer ends of the arms are connected to respective support members 95 and 96 such that enlarged central portion 94 is positioned over the four branches 68, 69 and 72, 73 of the conductors. Upon application of the pull down voltage to pad 86, central portion 94 of bridge 90 makes contact with dielectric layers 70, 74, to significantly increase switch capacitance, thereby lowering switch impedance thus allow signal propagation between conductors 62 and 63. Stiffener member 98 may be added to prevent possible bending of central portion 94 of bridge 90.

With the arrangement of FIG. 4, the switch exhibits lower loss since the microwave signal does not have to travel through an arm of the bridge. A metallic bridge arm is inductive and at microwave frequencies the arm may present a relatively high impedance. In the switch 60 of FIG. 4, the microwave signal travels from one conductor to the other only through the central portion 94 of bridge 90, and not through any arm of the bridge.

The switch 60 of FIG. 4 has one-fourth the off capacitance and will therefore have 12 dB higher isolation. With the ability to thin the dielectric layers in the switches described herein, the switches may have a capacitance ratio of 100:1, or more, with an extremely small off capacitance, e.g., under 0.015 pF (picofarads), allowing use out to about 40 GHz (gigahertz).

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A capacitive type MEMS switch comprising:

a) a substrate member;

b) a conductor arrangement deposited on said substrate, said conductor arrangement including first and second RF conductors;

c) first and second support members on said substrate;

d) a bridge member having a central portion and first and second arms extending out from said central portion;

e) said first and second arms being respectively connected to said first and second support members;

f) a dielectric layer deposited on a portion of said conductor arrangement;

g) said conductor arrangement defining an open area;

h) a pull down electrode positioned within said open area;

i) said pull down electrode being of a height less that that of said conductor arrangement, and being substantially surrounded by said conductor arrangement;

j) said central portion of said bridge member being drawn toward said conductor arrangement upon application of a control voltage to said pull down electrode, to present a relatively low impedance, allowing a signal to propagate between said first and second RF conductors.

2. A capacitive type MEMS switch according to claim 1 wherein:

said conductor arrangement (b) includes a first RF conductor having an end portion defining said open area and substantially surrounds said pull down electrode;

said first arm of said bridge member (d) is electrically conductive; and said conductor arrangement (b) includes a second RF conductor electrically connected to said first arm.

3. A capacitive type MEMS switch according to claim 1 wherein:

said conductor arrangement (b) includes first and second opposed RF conductors each including respective branches at the ends thereof; and wherein said branches define said open area and substantially surround said pull down electrode.

4. A capacitive type MEMS switch according to claim 1 wherein:

said central portion of said bridge member (d) is enlarged with respect to said arms.

5. A capacitive type MEMS switch according to claim 1 and further comprising:

l) a stiffener member positioned on said central portion of said bridge member (d).

6. A capacitive type MEMS switch according to claim 1 and further comprising:

m) a pad deposited on said substrate (a) for receiving said control voltage; and n) a thin film resistor connecting said pad (m) with said pull down electrode (h).

* * * * *